(12) United States Patent
Ge et al.

(10) Patent No.: US 9,379,035 B1
(45) Date of Patent: Jun. 28, 2016

(54) IC PACKAGE HAVING NON-HORIZONTAL DIE PAD AND LEAD FRAME THEREFOR

(71) Applicant: FREESCALE SEMICONDUCTOR, INC., Austin, TX (US)

(72) Inventors: You Ge, Tianjin (CN); Meng Kong Lye, Shah Alam (MY); Zhijie Wang, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/850,966

(22) Filed: Sep. 11, 2015

(30) Foreign Application Priority Data

Feb. 26, 2015 (CN) .......................... 2015 1 0139788

(51) Int. Cl.
| | | |
|---|---|---|
| *H01L 23/52* | (2006.01) | |
| *H01L 23/367* | (2006.01) | |
| *H01L 23/053* | (2006.01) | |
| *H01L 25/065* | (2006.01) | |
| *H01L 23/495* | (2006.01) | |
| *H01L 21/56* | (2006.01) | |
| *H01L 23/00* | (2006.01) | |

(52) U.S. Cl.
CPC .............. *H01L 23/367* (2013.01); *H01L 21/56* (2013.01); *H01L 23/053* (2013.01); *H01L 23/49541* (2013.01); *H01L 23/49568* (2013.01); *H01L 23/49575* (2013.01); *H01L 24/49* (2013.01); *H01L 24/85* (2013.01); *H01L 25/065* (2013.01); *H01L 2924/15158* (2013.01)

(58) Field of Classification Search
CPC ................. H01L 23/367; H01L 23/053; H01L 23/49541; H01L 23/49568; H01L 23/49575; H01L 24/49; H01L 24/85; H01L 25/065; H01L 21/56
USPC .......................................................... 257/692
See application file for complete search history.

(56) References Cited

U.S. PATENT DOCUMENTS

| | | | |
|---|---|---|---|
| 6,677,624 B2 | 1/2004 | Ihm | |
| 7,972,650 B1 * | 7/2011 | Church | ............. H01L 21/48867 427/117 |
| 8,323,607 B2 | 12/2012 | Liu et al. | |
| 8,552,542 B2 * | 10/2013 | Morioka | ........... H01L 23/49548 257/666 |
| 2007/0155064 A1 | 7/2007 | Chen et al. | |
| 2009/0194869 A1 | 8/2009 | Eom et al. | |
| 2012/0256305 A1 * | 10/2012 | Kaufmann | .............. G06F 21/87 257/659 |
| 2013/0082376 A1 | 4/2013 | Nagarkar et al. | |
| 2013/0093073 A1 | 4/2013 | Chen et al. | |

* cited by examiner

*Primary Examiner* — Tu-Tu Ho
(74) *Attorney, Agent, or Firm* — Charles E. Bergere

(57) ABSTRACT

A multi-component integrated circuit (IC) package has a base component (e.g., an interposer) defining a base of the IC package, a plurality of die pads extending from the base and forming side walls of the IC package, one or more IC dies, each mounted on an interior surface of one of the die pads, and bond wires electrically connecting the IC dies to another component of the IC package, such as the interposer or another die. By mounting dies on non-horizontal side walls, the IC package can provide more-effective thermal dissipation than conventional 3D IC packages having stacks of IC dies.

19 Claims, 8 Drawing Sheets

US 9,379,035 B1

IC PACKAGE HAVING NON-HORIZONTAL DIE PAD AND LEAD FRAME THEREFOR

BACKGROUND

The present invention relates to integrated circuit packaging and, more particularly, to IC packages having more than one integrated circuit die.

A conventional three-dimensional (3D) integrated circuit more interposers mounted below the stack of dies and/or between dies within the stack. One problem with such conventional 3D IC packages relates to the inability to effectively dissipate heat generated by dies located in the interior of the stack (i.e., dies other than the bottommost and topmost dies in the stack). Accordingly, it would be advantageous to have a 3D IC package with good heat dissipation properties.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, a multi-component IC package comprises (i) a base component defining a base of the IC package; (ii) a plurality of die pads extending from the base and forming side walls of the IC package; (iii) one or more IC dies, each mounted onto an interior surface of one of the die pads; and (iv) a plurality of wires, each wire connecting a corresponding IC die to another component of the IC package.

Figure 1:
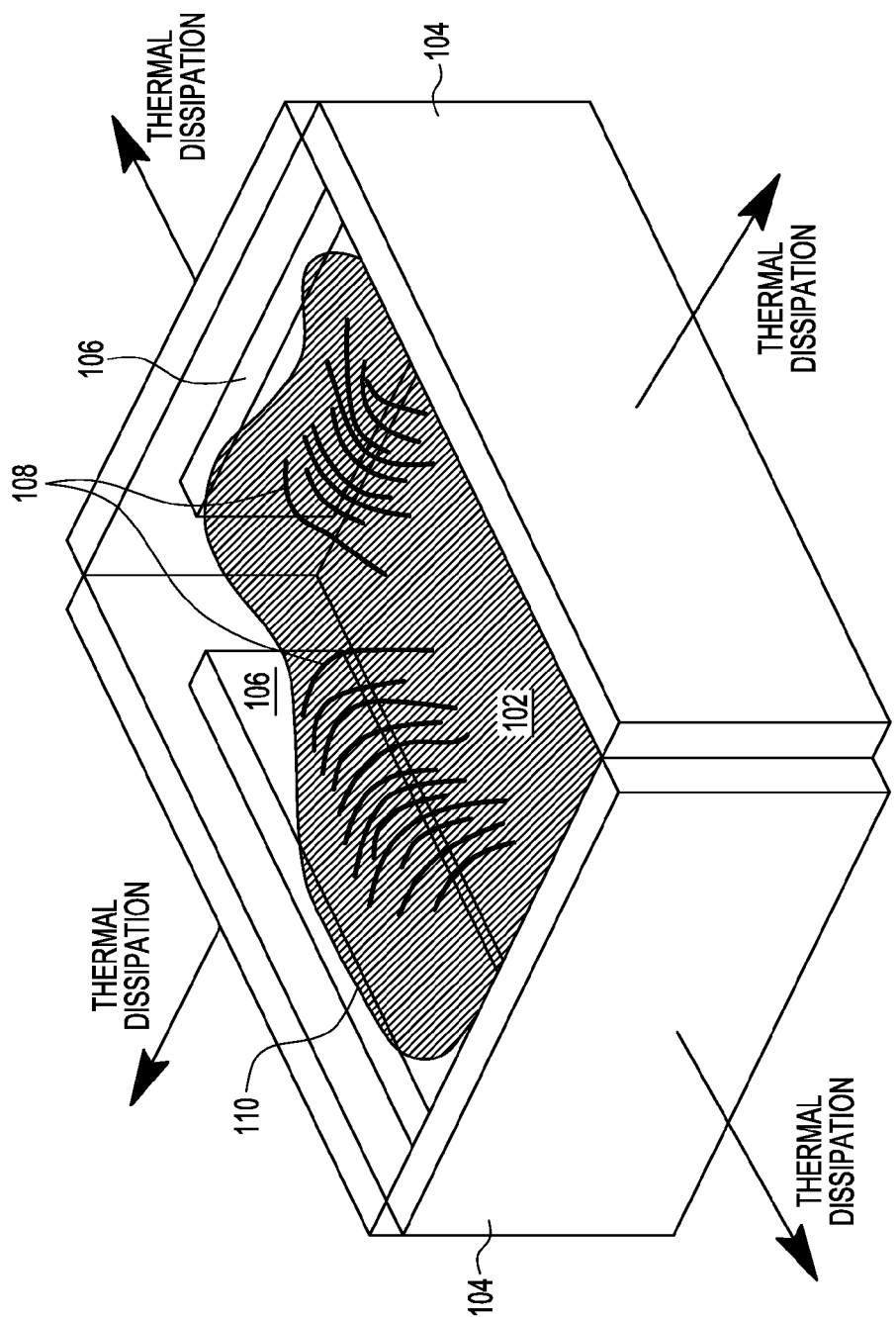
FIG. 1 is a perspective view of an IC package according to one embodiment of the invention.

FIG. 1 is a perspective view of an IC package 100 according to one embodiment of the invention. IC package 100 has a three-dimensional rectilinear shape defined by an interposer 102 at its base and four metal (e.g., copper) side walls 104. Although not shown in FIG. 1 and as described further below with respect to FIGS. 12 and 13, the IC package 100 may have an optional metal cap which forms the top of the IC package 100. Mounted on the inner surface of each side wall 104 is an IC die 106 that has wires 108 providing electrical connections to the interposer 102. As such, the side walls 104 function as die pads that receive the mounted dies 106. Some or all of the interior space within the IC package 100 is filled with a gel 110 (or other suitable encapsulating material) that encapsulates the wires 108 and holds the side walls 104 in place.

Because each die 106 is mounted on its own metal side wall 104 of the IC package 100, each side wall 104 functions as a heat sink that helps to dissipate heat generated by the mounted die 106 away from the IC package 100. Although not shown in FIG. 1, a heat sink may connected to each side wall 104 to further enhance heat dissipation from the IC package 100. In this way, the IC package 100 can provide more-effective thermal dissipation than a corresponding conventional 3D IC package having four analogous dies mounted in a conventional vertical stack.

FIGS. 2 through 13 represent different stages of one possible technique for assembling the IC package 100 of FIG. 1.

Figure 2:
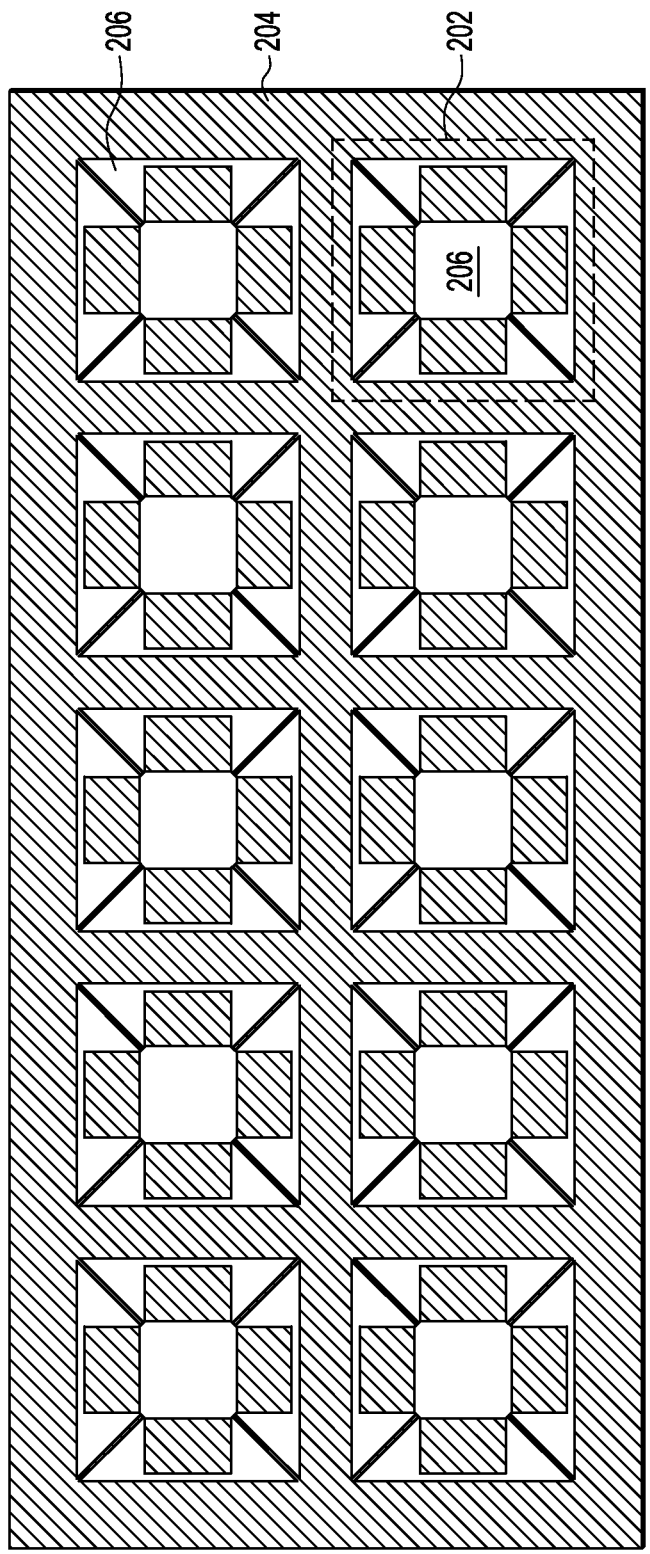
FIG. 2 is a plan view of a two-dimensional lead frame array according to one embodiment of the invention having ten lead frames within an array frame, where the ten lead frames can be used to assemble ten different instances of the IC package of FIG. 1.

FIG. 2 is a plan view of an example, two-dimensional, metal (e.g., copper) lead frame array 200 according to one embodiment of the invention having ten lead frames 202 within an array frame 204, where the ten lead frames 202 can be used to assemble ten different instances of the IC package 100 of FIG. 1. The lead frame array 200 is mounted on adhesive tape 206 that provides mechanical support for the various structural elements of the ten lead frames 202.

Figure 3:
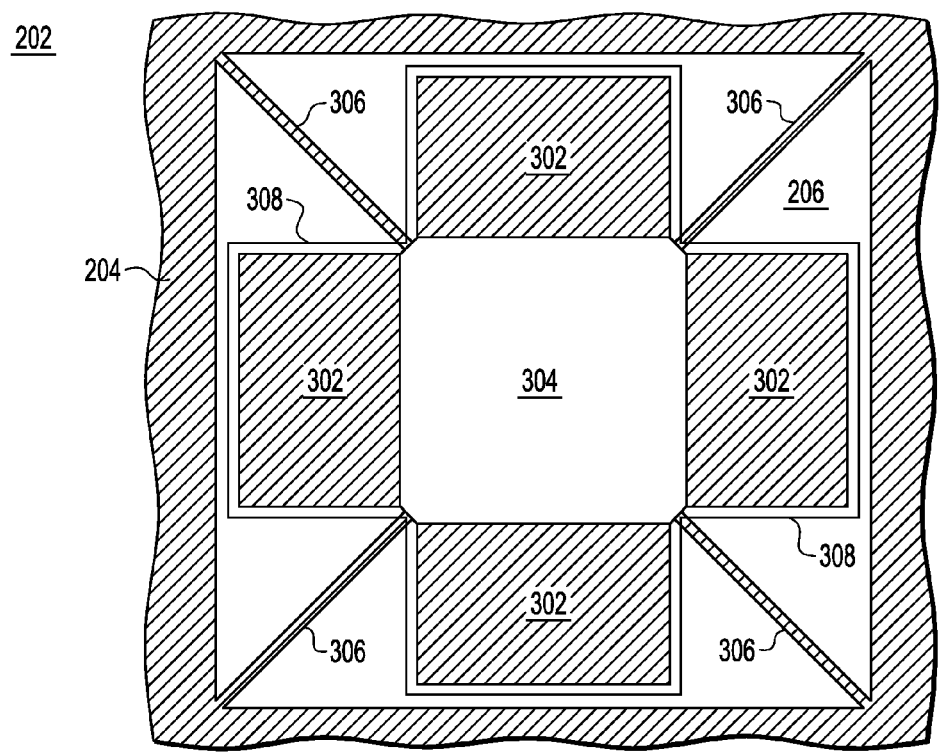
FIG. 3 is a plan view of one of the ten lead frames of FIG. 2 mounted on a corresponding portion of adhesive tape.

FIG. 3 is a plan view of one of the ten lead frames 202 of FIG. 2 mounted on a corresponding portion of the adhesive tape 206. As shown in FIG. 3, the lead frame 202 has four, rectangular, metal die pads 302 surrounding a rectangular (in this case, square) central opening 304 which exposes a corresponding portion of the adhesive tape 206. The lead frame 202 also has four diagonal tie bars 306, each of which is pivotally connected at one end to the corners of the two adjacent die pads 302 and at the other end to the array frame 204 to provide mechanical support between the die pads 302 and the rest of the lead frame array 200 until the adhesive tape 206 can be applied (e.g., between the time of the manufacture (e.g., by stamping) of the lead frame array 200 and its subsequent mounting onto the adhesive tape 206).

As indicated by label 308 in FIG. 3, the adhesive tape 206 is scored or otherwise cut around the periphery of the four die pads 302. In one implementation, the adhesive tape 206 is scored prior to the lead frame array 200 being mounted onto the adhesive tape 206. As described further below, this scoring enables the die pads 302 to be rotated out of the plane of the lead frame array 200 during the assembly process.

Figure 4:
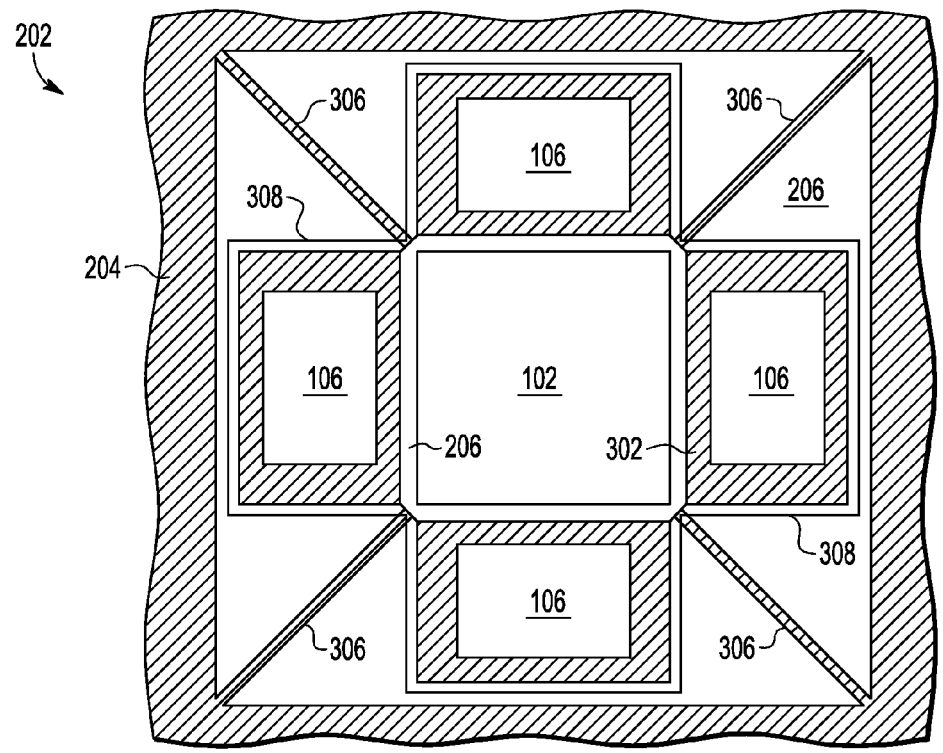
FIG. 4 is a plan view of the lead frame of FIG. 3 after (i) an interposer has been mounted onto the portion of the adhesive tape corresponding to a central opening in the lead frame and (ii) four dies have been mounted onto four die pads of the lead frame.

FIG. 4 is a plan view of the lead frame 202 of FIG. 3 after (i) the interposer 102 has been mounted onto the portion of the adhesive tape 206 corresponding to the central opening 304 in the lead frame 202 and (ii) the four dies 106 have been mounted onto the four die pads 302, e.g., using conventional pick-and-place machinery and a suitable thermally conductive epoxy (not shown).

Figure 5:
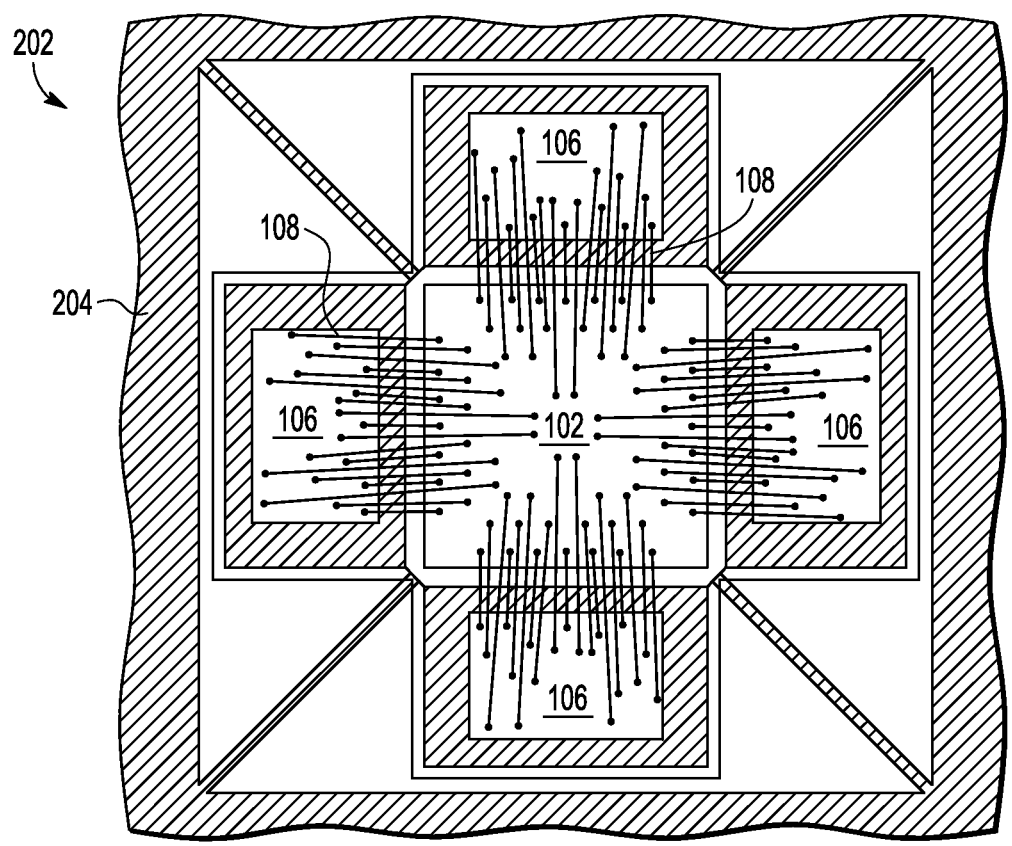
FIG. 5 is a plan view of the partial assembly of FIG. 4 after bond wires have been connected between the die and an interposer.

FIG. 5 is a plan view of the partial assembly of FIG. 4 after the wires 108 have been connected between each die 106 and the interposer 102. Depending on the particular implementation, the wires 108 may include insulated bond wires, insulated ribbon wires, insulated (e.g., carbon) nanotubes, and/or other suitable electrical connectors.

Figure 6:
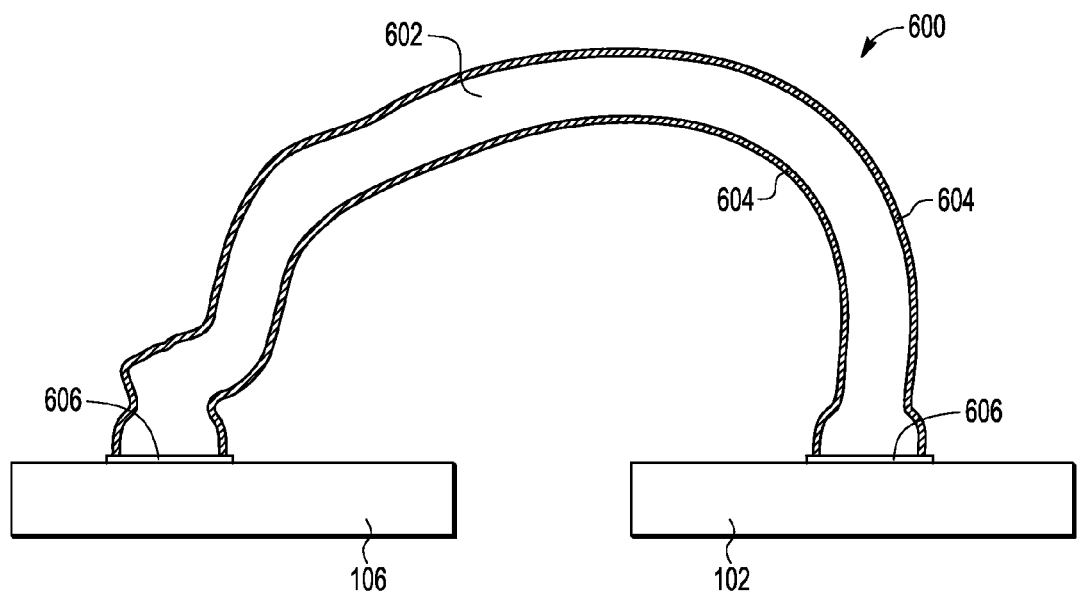
FIG. 6 is a cross-sectional side view of an insulated bond wire used as one of the wires of FIGS. 1 and 5 to connect the interposer to one of the dies.

FIG. 6 is a cross-sectional side view of an insulated bond wire 600 used as one of the wires 108 of FIGS. 1 and 5 to connect the interposer 102 to one of the dies 106. Bond wire 600 has a flexible conducting (e.g., metal) core 602 surrounded by a flexible, insulating outer sheath 604. As shown in FIG. 6, the bond wire 600 is wirebonded at one end to a die pad 606 on the interposer 102 and at the other end to a corresponding die pad 606 on the die 106.

Figure 7:
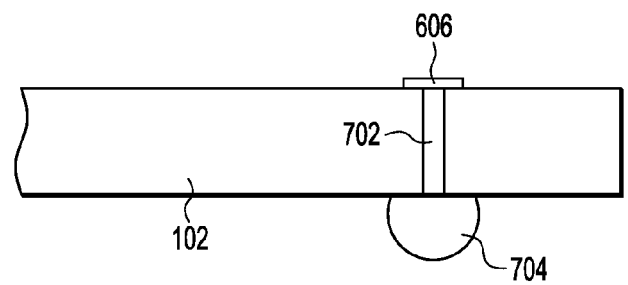
FIG. 7 is a cross-sectional side view of a portion of the interposer of FIG. 6 showing a through-silicon via (TSV) electrically connecting a die pad (to which the bond wire is connected) to a solder ball located on a bottom surface of the interposer.

FIG. 7 is a cross-sectional side view of a portion of the interposer 102 of FIG. 6 showing a through-silicon via (TSV) 702 electrically connecting the die pad 606 (to which the bond wire 600 is wirebonded) to a solder ball 704 located on the bottom surface of the interposer 102, which is also the bottom surface of the IC package 100 of FIG. 1 when the IC package 100 is assembled using bond wires such as the bond wire 600.

Figure 8:
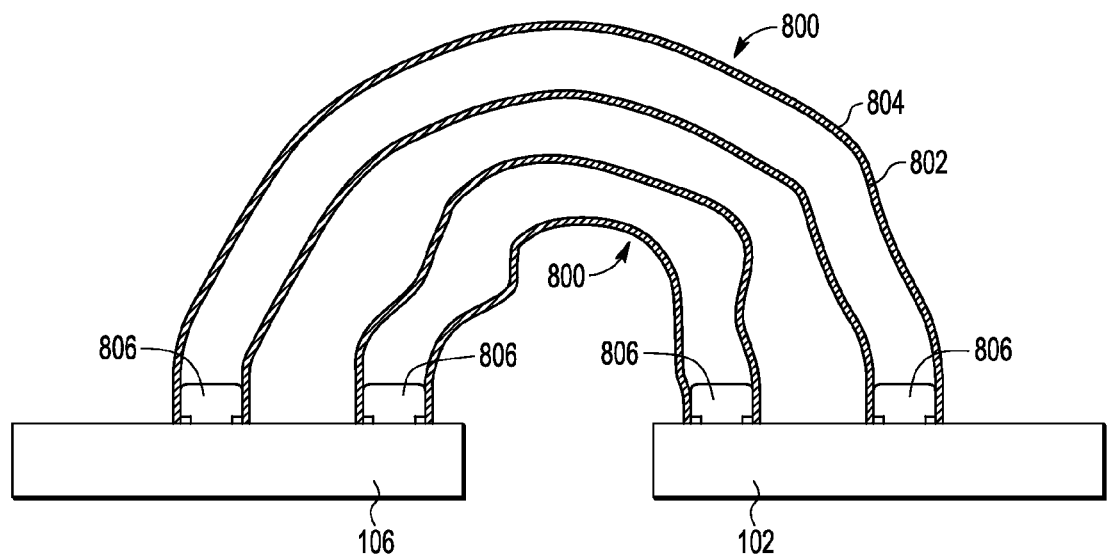
FIG. 8 is a cross-sectional side view of two insulated nanotubes used as two of the wires of FIGS. 1 and 5 to connect the interposer to one of the dies.

FIG. 8 is a cross-sectional side view of two insulated nanotubes 800 used as two of the wires 108 of FIGS. 1 and 5 to connect the interposer 102 to one of the dies 106. Each nanotube 800 is a flexible, hollow tube having a conducting inner surface 802 and an insulating outer surface 804. As shown in FIG. 8, each nanotube 800 is connected at one end to a wafer-level bump 806 on the interposer 102 and at the other end to a corresponding wafer-level bump 806 on the die 106. During bonding at a suitably high temperature, the nanotube diameter increases sufficiently to enable the ends of the nanotubes 800 to be inserted over the corresponding wafer-level bumps 806. As the temperature decreases, the nanotube diameter will also decrease, thereby securing the ends of the nanotubes 800 onto the wafer-level bumps 806.

Figure 9:
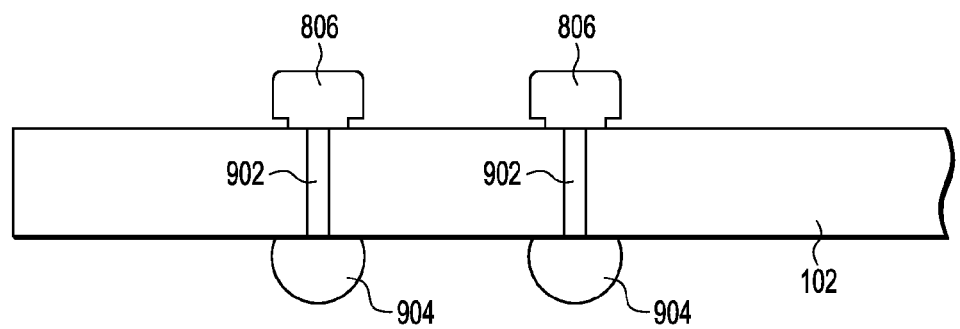
FIG. 9 is a cross-sectional side view of a portion of the interposer of FIG. 8 showing two TSVs electrically connecting wafer-level bumps (to which the nanotubes are connected) to two solder balls located on the bottom surface of the interposer.

FIG. 9 is a cross-sectional side view of a portion of the interposer 102 of FIG. 8 showing two TSVs 902 electrically connecting the wafer-level bumps 806 (to which the nanotubes 800 are connected) to two solder balls 904 located on the bottom surface of the interposer 102, which is also the bottom surface of the IC package 100 of FIG. 1 when the IC package 100 is assembled using nanotubes such as the nanotubes 800.

Although the wires 108 (i.e., the bond wire 600 of FIG. 6 and the nanotubes 800 of FIG. 8) are depicted in FIGS. 7 and 9 as being electrically connected to the solder balls 704 and 904 of the interposer 102 by vertical TSVs 702 and 902, in other implementations of the interposer 102, some or all of those electrical connections may be made using metal traces (not shown) within the interposer 102 that provide a fan-out function for the IC package 100. Furthermore, some metal traces (not shown) may provide electrical connections between two different wires 108 for chip-to-chip electrical connections rather than the TSV-based chip-to-solder-ball electrical connections of FIGS. 7 and 9.

Figure 10:
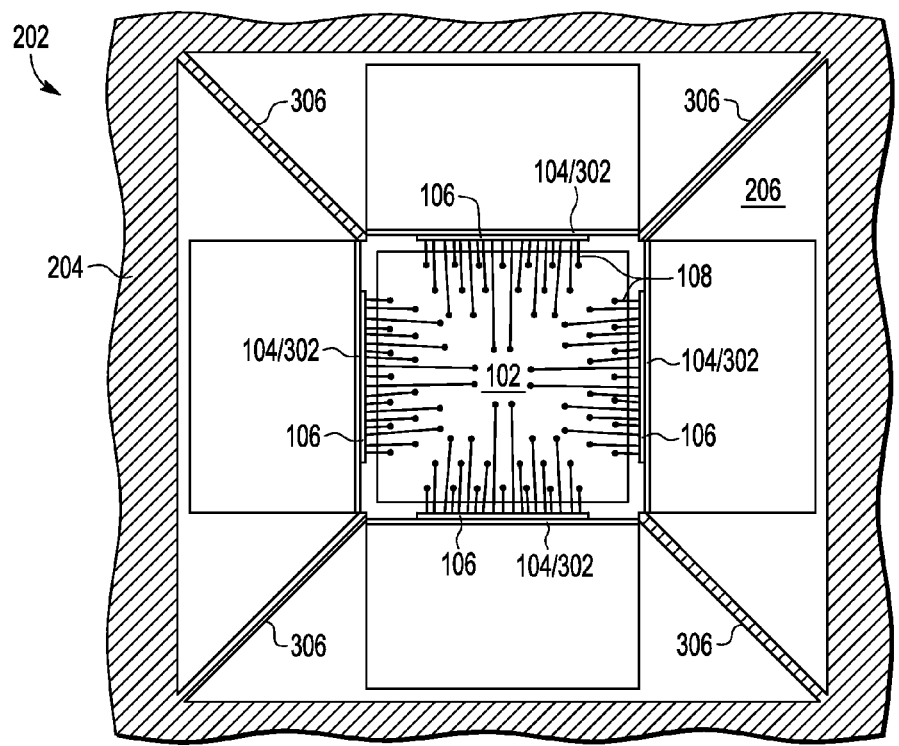
FIG. 10 is a plan view of the partial assembly of FIG. 5 after the four die pads have been rotated to be vertical relative to the plane of the lead frame array.

FIG. 10 is a plan view of the partial assembly of FIG. 5 after the four die pads 302 have been rotated 90 degrees (i.e., bent up at the pivotal connections to the four tie bars 306) to be vertical relative to the plane of the lead frame array 200. In one implementation, special tooling (not shown) is used to rotate the die pads 302 and their mounted dies 106 and corresponding portions of the scored, attached adhesive tape 206 while holding the interposer 102 in place, e.g., using a vacuum tool. As shown in FIG. 10, the four, now vertical mounted dies 106 maintain their electrical connections to the interposer 102 by virtue of the flexibility of the interconnecting, insulated wires 108. In one implementation, the rotation of the four die pads 302 causes the eight physical connections to the four tie bars 306 to break, thereby freeing the die pads 302 from the rest of the structure of the lead frame array 200. Note that the four die pads 302 are rotated to form the four vertical side walls 104 of the IC package 100 of FIG. 1.

Figure 11:
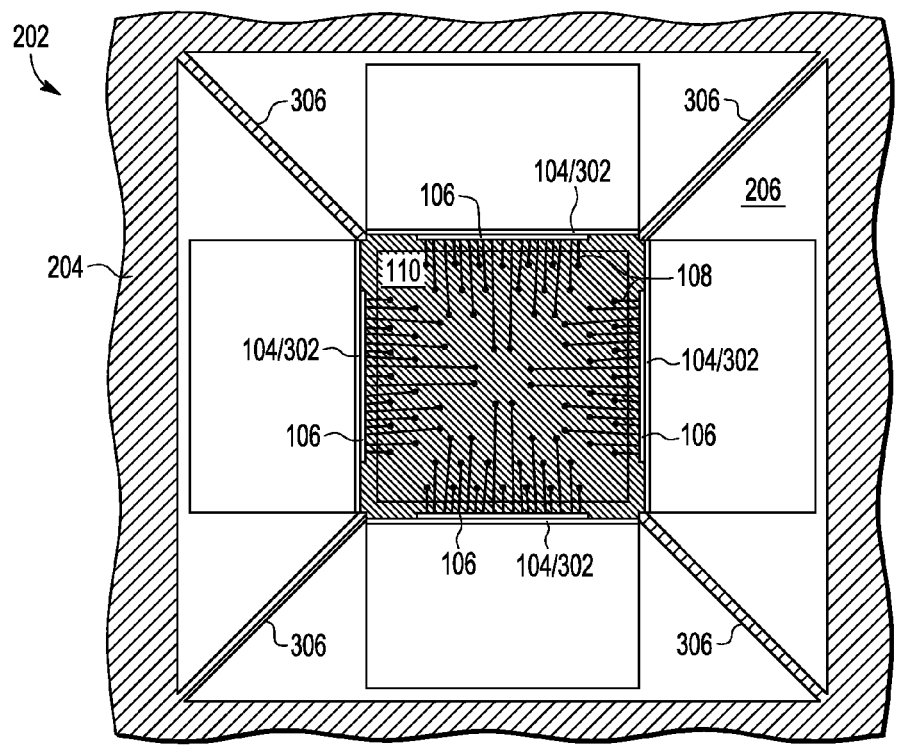
FIG. 11 is a plan view of the partial assembly of FIG. 10 after gel has been dispensed into the cavity defined by the interposer and the four vertical side walls formed by the die pads.

FIG. 11 is a plan view of the partial assembly of FIG. 10 after the gel 110 has been dispensed into the cavity defined by the interposer 102 and the four vertical side walls 104 formed by the rotated die pads 302. As described previously, the gel 110, which can be any suitable encapsulating material, encapsulates the wires 108 and holds the rotated die pads 302 in place.

Figure 13:
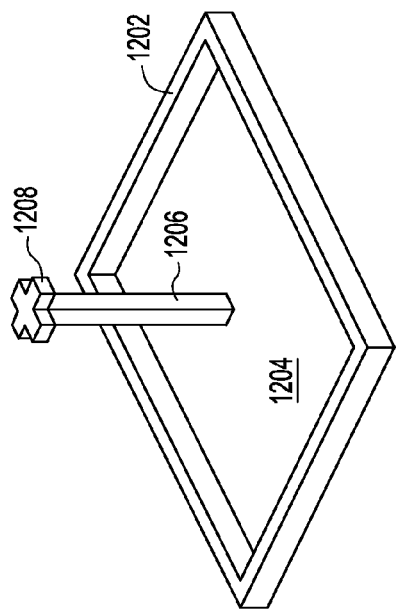
FIG. 13 is an upside-down, perspective view of the metal cap of FIG. 12.
Figure 12:
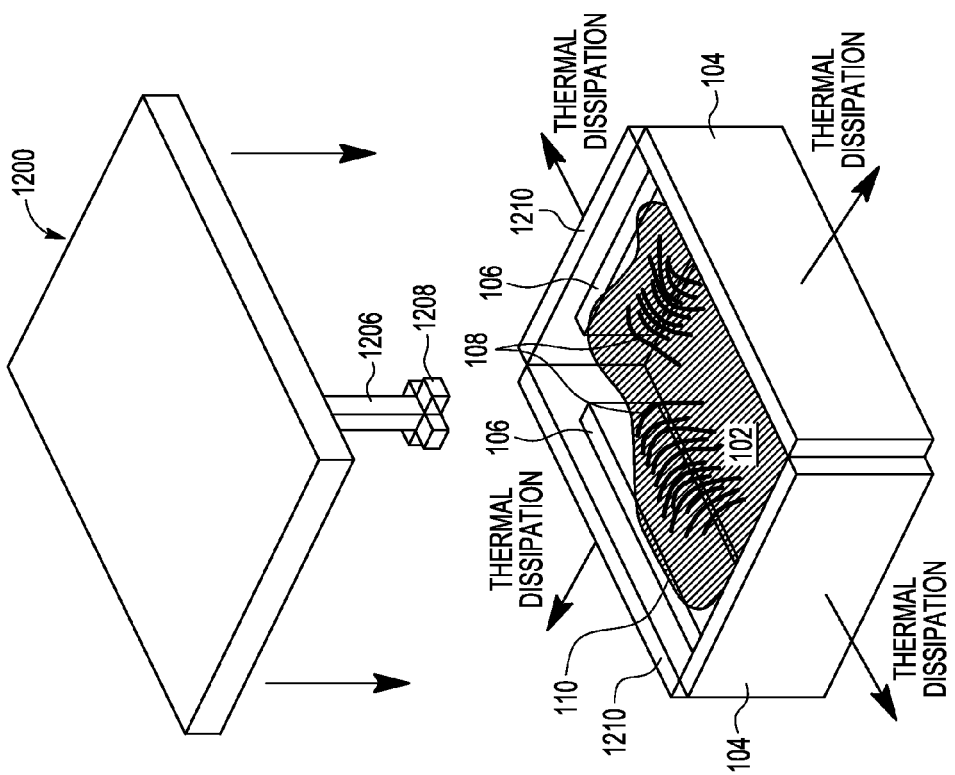
FIG. 12 is a perspective view showing an optional, rectangular, metal cap being placed over the assembly of FIG. 11.

FIG. 12 is a perspective view showing an optional, rectangular, metal cap 1200 being placed over the assembly of FIG. 11. FIG. 13 is an upside-down, perspective view of the metal cap 1200 of FIG. 12. As shown in FIG. 13, the metal cap 1200 has a rectangular outer rim 1202 defining an inner volume 1204 of the cap 1200 and a post 1206 having an anchor structure 1208 at its distal end. The outer rim 1202 is designed such that the upper edge 1210 of each rotated die pad 302 fits within the inner volume 1204 of the cap 1200 with the outer rim 1202 hanging over the outer surface of each upper edge 1210.

The metal cap 1200 is placed over the assembly of FIG. 11 before the gel 110 is completely cured such that the post 1206 extends into the gel 110 with the anchor structure 1208 submerged within the gel 110. After the gel 110 has been cured, the anchor structure 1208 and the post 1206 will permanently secure the cap 1200 in place on top of the IC package 100.

Whether or not the cap 1200 is used, after the gel 110 has been sufficiently cured, e.g., by baking and/or irradiating, the resulting assembly can be subjected to UV radiation to weaken the adhesive of the adhesive tape 206 to enable removal of the portions of the adhesive tape 206 from the bottom of the interposer 102 and the outer surfaces of the four die pads 302, thereby forming the completed IC package 100.

Although the present invention has been described in the context of the IC package 100 of FIG. 1, the present invention is not so limited. In general and although not shown in the figures, IC packages of the present invention:

May or may not have a cap;

May have a cap with or without a post and an anchor structure;

May or may not have one more heat sinks mounted on one or more outer surfaces of the IC package, including the outer surfaces corresponding to the side walls and the cap;

As long as the IC package has at least one IC die, zero, one, or more dies might be mounted in zero, one, or more side-by-side stacks on each rotated die pad, each stack having one or more dies;

Have three or more rotated die pads forming three or more side walls of the IC package;

Have side walls that are vertical or non-vertical relative to the IC package base;

Have wires forming electrical connections between a die and the interposer and/or between two dies;

May have an interposer that provides electrical connections to the outside world via TSVs and solder bumps and/or provides die-to-die connections that enable electrical connections between different dies within the IC package; and May have an interposer or another die or package component forming the base of the IC package.

A lead frame is a collection of metal leads and possibly other elements (e.g., power bars, die paddles also known as die pads and die flags) that is used in semiconductor packaging for assembling one or more integrated circuit (IC) dies into a single packaged semiconductor device. Prior to assembly into a packaged device, a lead frame may have support structures (e.g., a rectangular metal frame and tie bars) that keep those elements in place. During the assembly process, the support structures may be removed. As used herein, the term "lead frame" may be used to refer to the collection of elements before assembly or after assembly, regardless of the presence or absence of those support structures.

Unless explicitly stated otherwise, each numerical value and range should be interpreted as being approximate as if the word "about" or "approximately" preceded the value or range.

It will be further understood that various changes in the details, materials, and arrangements of the parts that have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A multi-component integrated circuit (IC) package comprising:
    a base component defining a base of the IC package;
    a plurality of die pads extending from the base and forming side walls of the IC package;
    one or more IC dies, each mounted on an interior surface of one of the die pads; and
    a plurality of wires, each wire connecting a corresponding IC die to another component of the IC package, and
    wherein the base component is an interposer, and at least one wire connects a corresponding IC die to the interposer.

2. The IC package of claim 1, wherein a bottom surface of the interposer has at least one solder ball electrically connected to the at least one wire by a through-silicon via in the interposer.

3. The IC package of claim 1, comprising four vertical die pads forming four side walls of the IC package, wherein a space defined by the base component and the four vertical die pads is at least partially filled with an encapsulant that encapsulates the wires.

4. The IC package of claim 1, wherein the wires comprise an insulated bond wires connected to bond pads on the base component and a corresponding IC die.

5. The IC package of claim 1, wherein the wires comprise an insulated nanotube connected to wafer-level bumps on the base component and a corresponding IC die.

6. The IC package of claim 1, further comprising an encapsulant that covers the wires.

7. The IC package of claim 6, further comprising a cap forming a top side of the IC package.

8. The IC package of claim 7, wherein the cap has a central post extending into the encapsulant such that the encapsulant secures the cap onto the IC package.

9. A lead frame for an IC package, the lead frame comprising a plurality of die pads surrounding a central opening and pivotally connected at pivotal connections such that each die pad can receive an IC die and be rotated about the pivotal connections relative to the central opening to define a side wall of the IC package having the mounted IC die.

10. The lead frame of claim 9, wherein the lead frame is mounted on adhesive tape, such that the adhesive tape located at the central opening can receive an interposer to be electrically connected to at least one mounted IC die by one or more wires.

11. The lead frame of claim 9, comprising four die pads located on four sides of a rectangular central opening and pivotally connected such that each die pad can receive a corresponding IC die and be rotated to a vertical orientation relative to the central opening to define a vertical side wall of the IC package having the mounted IC die, wherein the four vertical die pads define the four vertical side walls of a rectilinear IC package.

12. The lead frame of claim 11, further comprising four diagonal tie bars supporting the four die pads at eight pivotal connections, wherein the four diagonal tie bars connect the lead frame to one or more adjacent lead frames in a lead frame array.

13. The lead frame of claim 12, wherein the pivotal connections are configured to break when the die pads are rotated to the vertical orientations.

14. A method for assembling an IC package, the method comprising:
(a) mounting a base component onto adhesive tape located at the central opening of a lead frame having a plurality of die pads surrounding the central opening;
(b) mounting one or more IC dies onto one or more of the die pads;
(c) connecting wires between the base component and each mounted IC die;
(d) rotating each die pad relative to the base component to form a side wall of the IC package; and
(e) applying encapsulant to encapsulate the wires.

15. The method of claim 14, wherein:
the central opening is rectangular;
the lead frame has four die pads located on the four sides of a rectangular central opening;
step (b) comprises mounting the one or more IC dies onto the four die pads; and
step (d) comprises rotating the four die pads with the one or more connected, mounted IC dies to form four vertical side walls of the IC package.

16. The method of claim 15, further comprising:
applying a cap over the four side walls to form a top side of the IC package, wherein:
the cap has a post extending into the interior of the IC package;
the cap is applied before the encapsulant is fully cured; and
the encapsulant is fully cured to anchor the post within the cured encapsulant to secure the cap onto the IC package.

17. The method of claim 14, wherein:
the lead frame has tie bars supporting the die pads at bar/pad interconnections; and
the bar/pad interconnections break when the die pads are rotated relative to the base component.

18. The method of claim 14, wherein the base component is an interposer.

19. An IC package assembled using the method of claim 14.

* * * * *